United States Patent
Akenaga et al.

(10) Patent No.: US 12,183,598 B2
(45) Date of Patent: Dec. 31, 2024

(54) NOZZLE AND LIQUID EJECTION SYSTEM

(71) Applicant: ASAHI SUNAC CORPORATION, Aichi (JP)

(72) Inventors: Hiroki Akenaga, Aichi (JP); Kenta Nakamori, Aichi (JP); Fumiya Sakai, Aichi (JP)

(73) Assignee: ASAHI SUNAC CORPORATION, Aichi (JP)

( * ) Notice: Subject to any disclaimer, the term of this patent is extended or adjusted under 35 U.S.C. 154(b) by 422 days.

(21) Appl. No.: 17/619,020

(22) PCT Filed: Jul. 24, 2019

(86) PCT No.: PCT/JP2019/029014
§ 371 (c)(1),
(2) Date: Dec. 14, 2021

(87) PCT Pub. No.: WO2021/014610
PCT Pub. Date: Jan. 28, 2021

(65) Prior Publication Data
US 2022/0351985 A1    Nov. 3, 2022

(51) Int. Cl.
*H01L 21/67*       (2006.01)
*B05B 1/02*        (2006.01)
(Continued)

(52) U.S. Cl.
CPC .......... *H01L 21/67051* (2013.01); *B05B 1/02* (2013.01); *B05B 17/06* (2013.01);
(Continued)

(58) Field of Classification Search
CPC ..... B05B 1/02; B05B 17/06; H01L 21/67051; B08B 3/02; B08B 3/12; B08B 2203/027
(Continued)

(56) References Cited

U.S. PATENT DOCUMENTS 7,584,546 B2 *  9/2009  Chabot .................. B24C 1/045
                                                      33/645

FOREIGN PATENT DOCUMENTS

CN      102513237      3/2014
CN      207745859      8/2018
(Continued)

OTHER PUBLICATIONS

International Search Report issued Oct. 29, 2019 in International (PCT) Application No. PCT/JP2019/029014.

*Primary Examiner* — Christopher S Kim
(74) *Attorney, Agent, or Firm* — Wenderoth, Lind & Ponack, L.L.P.

(57) ABSTRACT

A nozzle include a first portion, a second portion joined to the first portion, and a third portion joined to the second portion. The first portion includes a first inner wall surface and a first flow channel including a first inlet and a first outlet. The second portion includes a second inner wall surface and a second flow channel including a second inlet having an inner diameter less than an inner diameter of the first outlet and a second outlet. The third portion includes a third inner wall surface and a third flow channel including a third inlet having an inner diameter greater than the inner diameter of the second outlet and a third outlet. The third flow channel includes a diameter-decreasing section having an inner diameter that gradually decreases and a straight section having an inner diameter less than the inner diameter of the second outlet and constant.

6 Claims, 12 Drawing Sheets

(51) Int. Cl.
 *B05B 17/06* (2006.01)
 *B08B 3/02* (2006.01)
 *B08B 3/12* (2006.01)

(52) U.S. Cl.
 CPC ............... *B08B 3/02* (2013.01); *B08B 3/12* (2013.01); *B08B 2203/027* (2013.01)

(58) Field of Classification Search
 USPC ............................................. 239/589, 102.1
 See application file for complete search history.

(56) References Cited

FOREIGN PATENT DOCUMENTS

| EP | 1 306 136 | 5/2003 |
|---|---|---|
| JP | 55-153150 | 11/1980 |
| JP | 5-212317 | 8/1993 |
| JP | 2001-044602 | 2/2001 |
| JP | 2005-205397 | 8/2005 |
| JP | 2010-129840 | 6/2010 |
| JP | 2014-64979 | 4/2014 |

* cited by examiner

NOZZLE AND LIQUID EJECTION SYSTEM

TECHNICAL FIELD

The present disclosure relates to a nozzle and a liquid ejection system.

BACKGROUND ART

High-pressure cleaning systems for cleaning flat panel displays or semiconductor wafers by spraying high-pressure cleaning solutions on surfaces of the flat panel displays or the semiconductor wafers have been known. A technology to improve detergency in such high-pressure cleaning systems is proposed. The technology includes applying ultrasonic waves to the cleaning solution by an ultrasonic wave generator and ejecting the cleaning solution.

In the configuration described above, a cleaning nozzle equipped with the ultrasonic wave generator is required, that is, the configuration of the system tends to be complicated.

SUMMARY

A nozzle disclosed herein includes a first portion, a second portion, and a third portion. The first portion includes a first flow channel and a first inner wall surface that defines the first flow channel. The first flow channel includes a first inlet through which the liquid enters the first flow channel and a first outlet through which the liquid exits the first flow channel. The second portion is joined to the first portion. The second portion includes a second flow channel and a second inner wall surface that defines the second flow channel. The second flow channel continues into the first flow channel. The second flow channel includes a second inlet through which the liquid enters the second flow channel and a second outlet through which the liquid exits the second flow channel. The second inlet has an inner diameter less than an inner diameter of the first outlet of the first flow channel. The third portion is joined to the second portion. The third portion includes a third flow channel and a third inner wall surface that defines the third flow channel. The third flow channel continues into the second flow channel. The third flow channel includes a third inlet through which the liquid enters the third flow channel and a third outlet through which the liquid exits the third flow channel. The third inlet has an inner diameter greater than an inner diameter of the second outlet of the second flow channel. The third flow channel includes a diameter-decreasing section and a straight section. The diameter-decreasing section is adjacent to the second flow channel and having an inner diameter that gradually decreases from the third inlet toward the third outlet. The straight section is between the diameter-decreasing section and the third outlet. The straight section has an inner diameter less than the inner diameter of the second outlet of the second flow channel and constant.

A liquid ejection system described herein include the nozzle described above and a high-pressure pump connected to the nozzle to pressurize the liquid and to supply the liquid to the nozzle.

According to the nozzle and a liquid ejection system including the nozzle described herein, a separate device for generating a vibrating flow such as an ultrasonic generator is not required. Therefore, the configuration of the system is less likely to be complicated.

DETAILED DESCRIPTION

An embodiment will be described with reference to FIGS. 1 to 3. A cleaning system 1 in this embodiment (corresponding to a liquid ejection system) is a system for cleaning an object W to be processed by ejecting a liquid (ultrapure water) at high pressure. Examples of the object W include flat-panel displays and semiconductor wafers.

Figure 1:
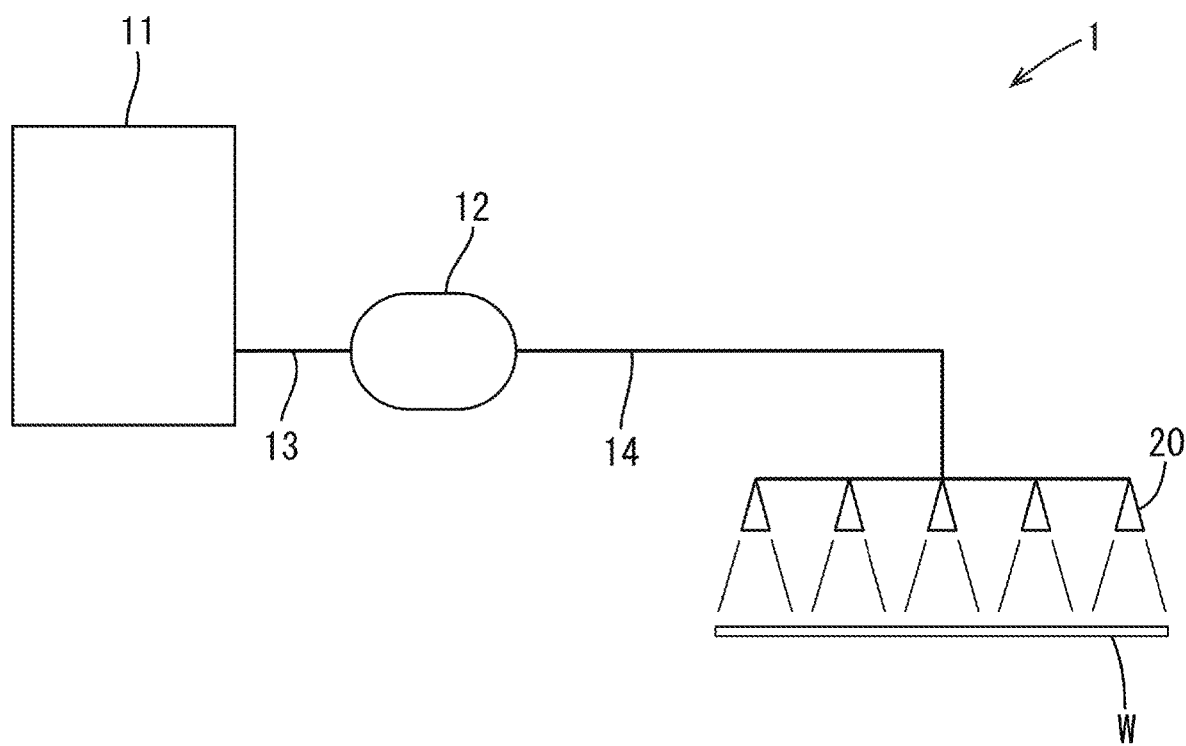
FIG. 1 is a schematic overall view of a cleaning system according to an embodiment.

As illustrated in FIG. 1, the cleaning system 1 includes a tank 11, a high-pressure pump 12, and nozzles 20. The tank 11 holds a liquid. The tank 11 and the high-pressure pump 12 are connected to each other via a pipe 13. The high-pressure pump 12 and the nozzles are connected to each other via a pipe 14.

The high-pressure pump 12 pressurizes the liquid supplied from the tank 11 and supplies the liquid to the nozzles 20. The high-pressure pump 12 pressurizes the liquid so that the ejecting pressure of the liquid ejected through the nozzles 20 is in a range from 1 MPa to 30 MPa including 30. A proper ejecting pressure may be defined for the object W. If the ejecting pressure is less than 1 MPa, the cleaning effect may decrease. If the ejecting pressure is greater than 30 MPa, the damages to the object W or the errors in the conveyer system may occur. To achieve preferable cleaning effect, it is preferable that the liquid is pressurized to be ejected in the range from 1 MPa to 30 MPa including 30 MPa.

The nozzles 20 are one-liquid nozzles through which a liquid supplied from the high-pressure pump 12 is ejected toward the object W. As illustrated in FIG. 2, the nozzles 20 include pipe coupling portions 30, orifice portions 40, accelerating portions 50, and holding portions 60. The pipe coupling portions 30 are coupled to the pipes 14 that are coupled to the high-pressure pump 12. The orifice portions 40 are coupled to the pipe coupling portions 30. The accelerating portions 50 are coupled to the orifice portions 40. The pipe coupling portion 30, the orifice portion 40, and the accelerating portion 50 of each nozzle 20 are held by the holding portion 60 of each nozzle 20. The pipe coupling portion 30, the orifice portion 40, and the accelerating portion 50 of each nozzle 20 are provided as separate components and joined together by the holding component 60 that holds those three components. The pipe coupling portions 30 include supply flow channels 33. The orifice portions 40 include drawing flow channels 43 continuing into the supply flow channels 33. The accelerating portions 50 include the accelerating flow channels 55 continuing into the drawing flow channels 43. As illustrated in FIG. 2, the supply flow channels 33, the drawing flow channels 43, and the accelerating flow channels 55 form flow channels 21 through which the liquid flows.

Figure 2:
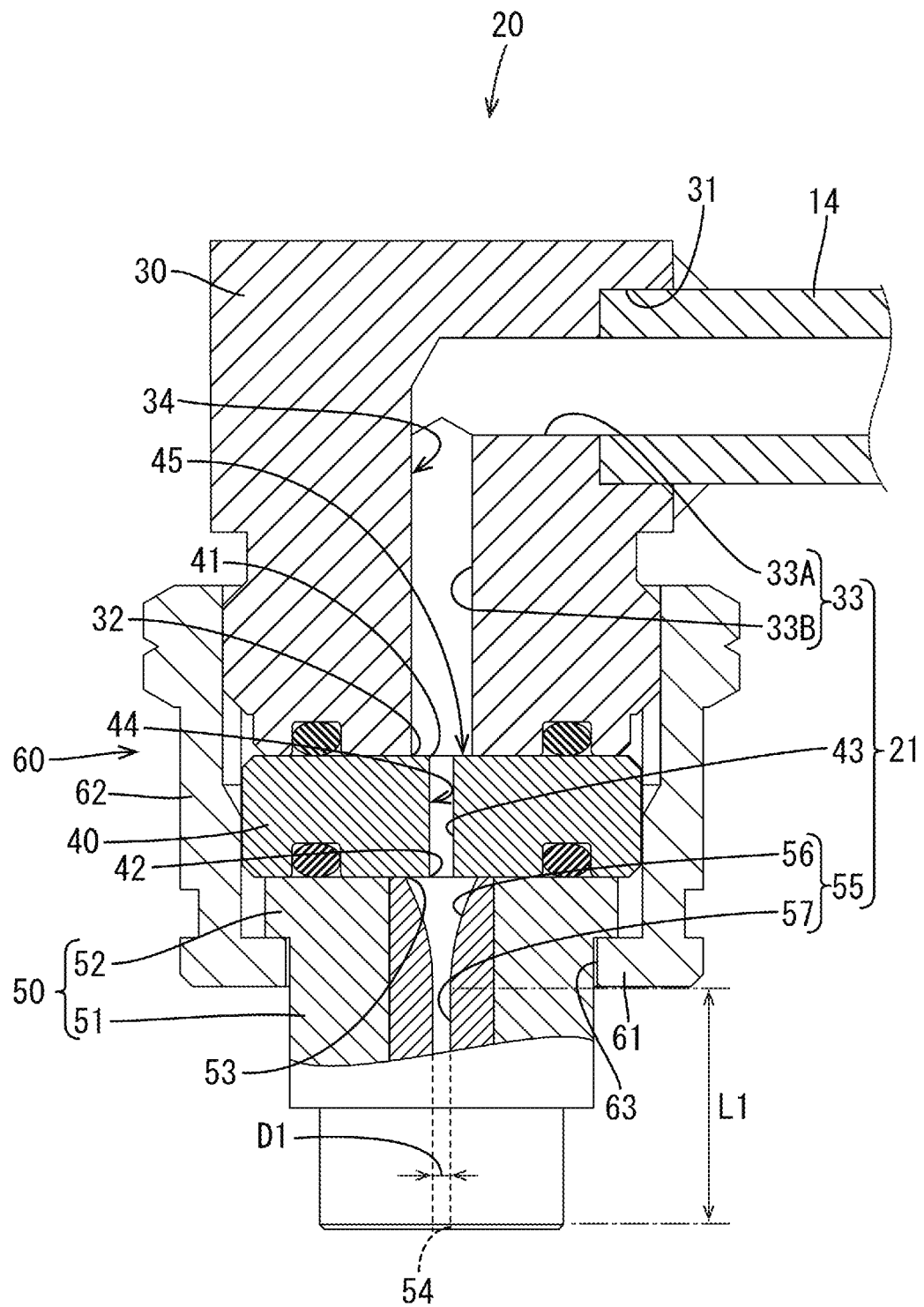
FIG. 2 is a cross-sectional view of a nozzle coupled to a pipe in the embodiment.

As illustrated in FIG. 2, each pipe coupling portion 30 has a round columnar shape. The pipe coupling portions 30 include pipe fixing holes 31 and the supply flow channels 33 continuing into the pipe fixing holes 31. The pipe fixing holes 31 include openings in outer wall surfaces of the pipe coupling portions 30. Joints coupled to first ends of the pipe 14 are fixed inside the pipe fixing holes 31. The supply flow channels 33 include first supply flow channels 33A and second supply flow channels 33B. The first supply flow channels 33A continue into the pipe fixing holes 31 and extend toward a center axes of the pipe coupling portions 30. The second supply flow channels 33B continue into the first supply flow channels 33A and extend along the center axes of the pipe coupling portions 30. Each second supply flow channel 33B has a linear pipe shape. The second supply flow channels 33B include first outlets 32 in first end surfaces (a lower surface in FIG. 2) of the pipe coupling portions 30 through which the liquid flows out.

As illustrated in FIG. 2, each orifice portion 40 has a round columnar overall shape. The orifice portions 40 include the drawing flow channels 43. The drawing flow channels 43 are flow channels that extend along the center axes of the orifice portions 40. Each drawing flow channel 43 has a linear pipe shape. The drawing flow channels 43 include second inlets 41 in first end surfaces of the orifice portions 40 and second outlets 42 in second end surfaces of the orifice portions 40, that is, the drawing flow channels 43 open through the orifice portions 40.

The orifice portions 40 are disposed on the pipe coupling portions 30 such that surfaces (an upper surface in FIG. 2) of the orifice portions 40 including the second inlets 41 contact the surfaces including the first outlets 32. Each orifice portion 40 is concentrically disposed with the corresponding pipe coupling portion 30. The drawing flow channels 43 continue into the second supply flow channels 33B.

Figure 3:
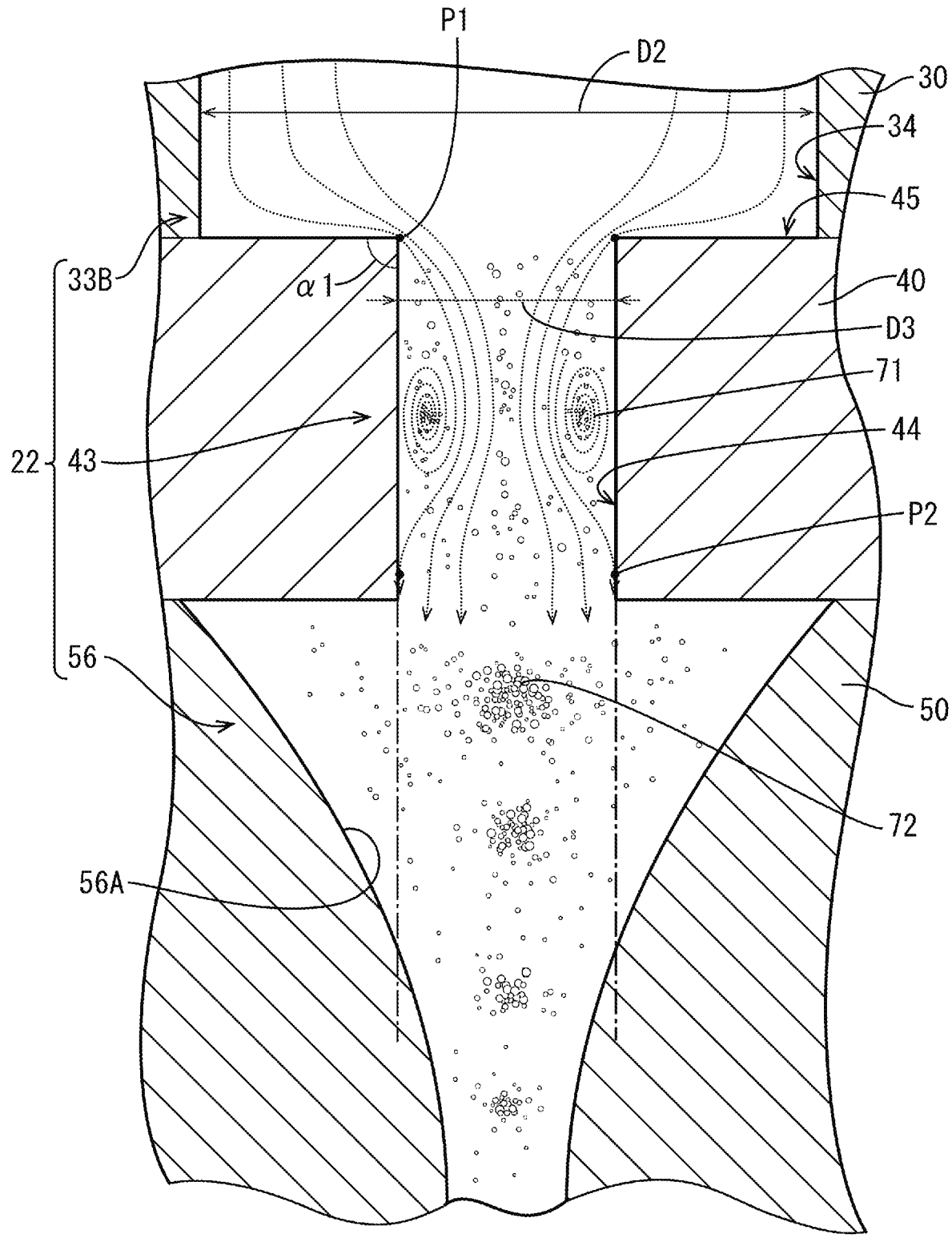
FIG. 3 is a view schematically illustrating a flow of liquid in a vibration generating flow channel.

As illustrated in FIGS. 2 and 3, the drawing flow channels 43 have an inner diameter D3 less than an inner diameter D2 of the second supply flow channels 33B. Namely, the inner diameter D3 of the second inlets 41 is less than the inner diameter D2 of the first outlets 32. At borders between the second supply flow channels 33B and the drawing flow channels 43, step surfaces 45 are disposed. The step surfaces 45 include sections of the surfaces of the orifice portions 40 including the second inlets 41 adjacent to hole edges of the second inlets 41. The step surfaces 45 connect first inner wall surfaces 34 included in the pipe coupling portions 30 to second inner wall surfaces 44 included in the orifice portions 40. The first inner wall surfaces 34 define the second supply flow channels 33B. The second inner wall surfaces 44 define the drawing flow channels 43. An angle α between the step surfaces 45 and the second inner wall surfaces 44 is 90°.

As illustrated in FIG. 2, the accelerating portions 50 include accelerating portion bodies 51 and flanges 52. Each accelerating portion body 51 has a round columnar shape. The flanges 52 project from outer wall surfaces of the accelerating portion bodies 51. The accelerating portion bodies 51 include accelerating flow channels 55. The accelerating flow channels are flow channels that extend along center axes of the accelerating portion bodies 51. The accelerating portion bodies 51 include third inlets 53 in first end surfaces and third outlets 54 in second end surfaces. The accelerating flow channels 55 open through the accelerating portion bodies 51.

The accelerating portions 50 are disposed on the orifice portions 40 such that the surfaces including the third inlets 53 (the upper surface in FIG. 2) contact the surfaces including the second outlets 42 (the lower surface in FIG. 2). Each accelerating portion 50 is concentrically disposed with the corresponding pipe coupling portion 30 and the corresponding orifice portion 40. The accelerating flow channels 55 continue into the drawing flow channels 43. The accelerating flow channels 55 include straight sections 57 and diameter-decreasing sections 56. The straight sections 57 are on third outlet 54 sides. Each straight section 57 has a linear pipe shape. The diameter-decreasing sections 56 continue into the straight section 57. Each diameter-decreasing section 56 has an inner diameter that gradually decreases from the third inlet 53 on the drawing flow channel 43 side to the straight section 57. Each diameter-decreasing section 56 includes an inner wall surface that is formed such that the inner diameter gradually decreases from the third inlet 53 to the straight section 57 and the inner wall surface smoothly joins the straight section 57 without a step. Portions of the diameter-decreasing sections 56 adjacent to the drawing flow channels 43 are defined as larger-diameter sections 56A having an inner diameter greater than the diameter of the drawing flow channels 43. The straight sections 57 have an inner diameter slightly less than the diameter of the drawing flow channels 43.

As illustrated in FIG. 3, the second supply flow channels 33B, the drawing flow channels 43, and the larger-diameter sections 56A form the vibration generating flow channels 22 that generate the vibrating flow of the liquid flowing through the larger-diameter sections 56A.

As illustrated in FIG. 2, the holding portions 60 include bottom wall sections 61 and tubular holding sections 62. Each bottom wall section 61 includes a circular shape. The tubular holding sections 62 extend from outer edges of the bottom wall sections 61. Each tubular holding section 62 has a tubular shape. The bottom wall sections 61 include insertion holes 63 through which the accelerating portion bodies 51 can be inserted. The accelerating portion bodies 51 of the accelerating portions 50 are passed through the insertion holes 63 and large portions of the accelerating portion bodies 51 on the third outlet sides project from the holding portions 60. The accelerating portions 50 are held by the holding portions 60 with the flanges 52 abutting on the bottom wall sections 61. The orifice portions 40 and portions of the pipe coupling portions 30 on the first outlet 32 sides are fixed in the tubular holding sections 62.

To clean the object W using the cleaning system 1 having the configuration described above, the liquid pressurized by the high-pressure pump 12 is supplied into the nozzles 20 via the pipe fixing holes 31, passed through the supply flow channels 33, the drawing flow channels 43, and the accelerating flow channels 55, and then ejected through the third outlets 54. The liquid is sprayed on the object W. Through the operation, the object W is cleaned.

The nozzles 20 include the vibration generating flow channels 22 to generate the vibrating flows of the liquid flowing through the vibration generating flow channels 22. According to the configuration, a separate device such as an ultrasonic generating device is not required for generating the vibrating flows and thus the configuration of the cleaning system 1 is less likely to be complicated. The vibration generating flow channels 22 include the second supply flow channels 33B, the drawing flow channels 43, and the larger-diameter sections 56A. The drawing flow channels 43 continue into the downstream ends of the second supply flow channels 33B. The drawing flow channels 43 have the inner diameter less than the diameter of the second supply flow channels 33B. The larger-diameter sections 56A continue into the downstream ends of the drawing flow channels 43. The larger-diameter sections 56A have the inner diameter greater than the diameter of the drawing flow channels 43. According to the configuration, the vibrating flows of the liquid can be generated with the simple configuration.

The vibrating flows of the liquid flowing through the vibration generating flow channels 22 may be generated by the following mechanism.

As illustrated in FIG. 3, when the liquid enters the drawing flow channel 43 through the second supply flow channel 33B, flow separation occurs at the hole edge of the second inlet 41. The separated flow reattach to the wall surface of the drawing flow channel 43. In FIG. 3, point P1 represents a separation point and point P2 represents a reattachment point. A vortex 71 is generated at around the second inner wall surface 44 between the separating point P1 and reattachment point P2. At the center of the vortex 71, the pressure is locally equal to or less than the saturated vapor pressure and bubbles (separation bubbles) are formed (cavitation) at the center. When the bubbles expand to a certain size, the bubbles flow downward. With the formation and the release of the separation bubbles intermittently repeated, the vibrating flow with periodic vibration is generated.

After the vibrating flow enters the larger-diameter section 56A, bubble clouds 72 that are clusters of the separation bubbles appear. The bubble clouds 72 periodically flow toward the downstream end of the accelerating flow channel 55.

A ratio of the inner diameter D3 of the drawing flow channel 43 to the inner diameter D2 of the second supply flow channel 33B (a drawing ratio β) is expressed by equation (1). It is preferable that the drawing ratio β is in a range from 0.04 to 0.8 including 0.8. When the drawing ratio β is in the range, the sufficient vibrating flow of the liquid flowing through the nozzle 20 is generated.

$$\beta = D3/D2 \tag{1}$$

With the liquid passing through the accelerating flow channel 55, the ejection velocity of the liquid ejected through the third outlet 54 can be increased. According to the Reynolds theory, basins of the flow of the liquid in the liquid flow channels of the nozzle include a narrow basin, a vortex basin, and a turbulent basin in this sequence from a base end side. The section of the accelerating flow channel 55 between the third inlet 53 and the straight section 57 is defined as the diameter-decreasing section 56 having the inner diameter that gradually decreases without a step. According to the configuration, a loss of pressure is reduced and thus the liquid is properly drawn into the straight section 57. The ratio of the length L of the straight section 57 in the axial direction to the diameter D1 (L1/D1) is equal to or greater than 7.8. According to the configuration, the third outlet 54 that is the spout through which the liquid from the nozzle 20 is ejected can be disposed in the turbulent basin and thus the velocity of the liquid ejected through the spout can be sufficiently increased. This further improves the detergency. If (L1/D1) is too large, the diameters of the droplets of the liquid tend to be large. Therefore, it is preferable that (L1/D1) is equal to or less than 15.

By spraying the liquid with the vibrating flow caused by the nozzle 20 that include the vibration generating flow channel 22 on the object W, the detergency further improves. The liquid is accelerated by the accelerating flow channel 55 and sprayed on the object W. This further improves the detergency.

Modification

Figure 4:
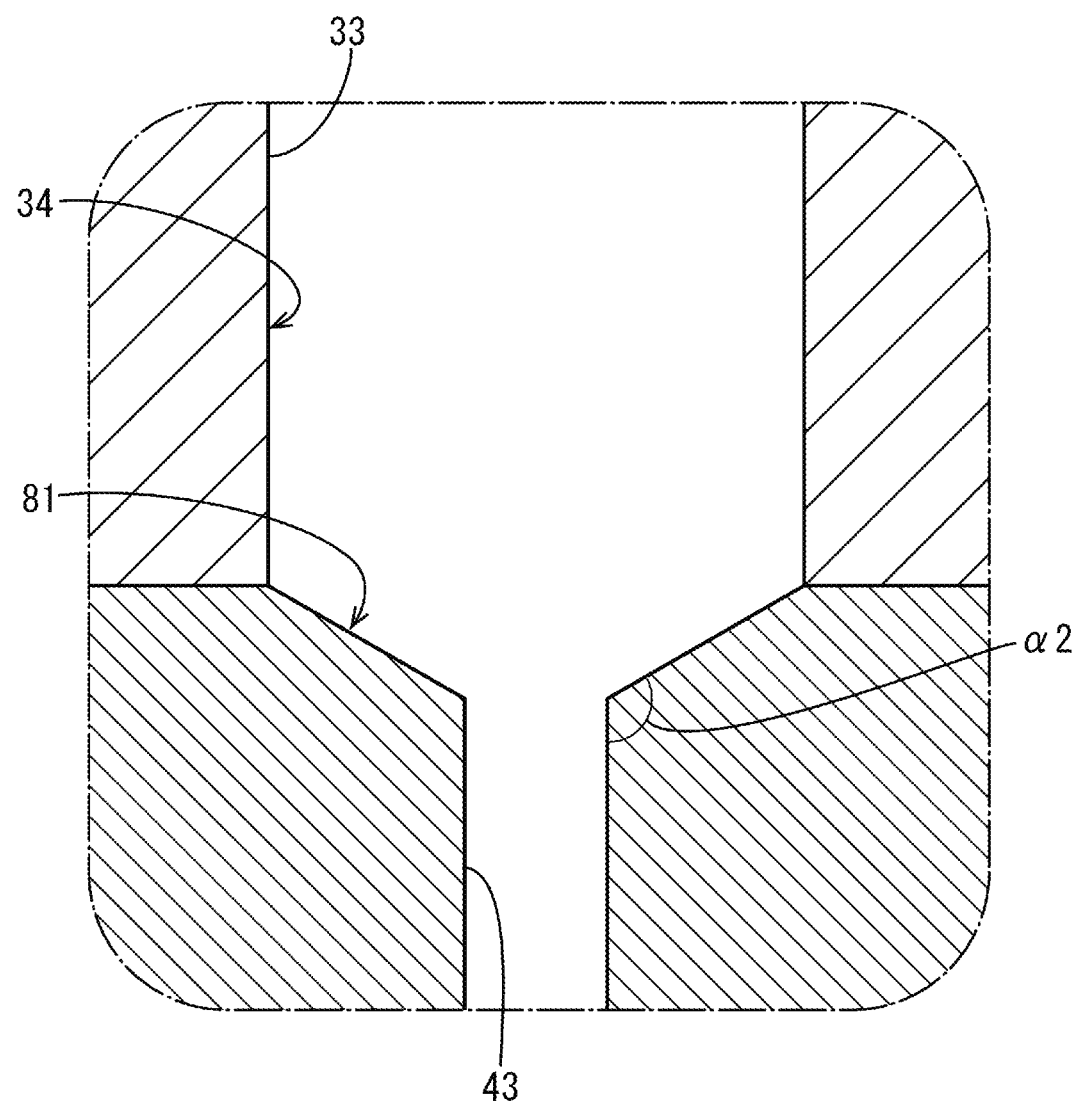
FIG. 4 is a magnified cross-sectional view of a portion of a nozzle in a modification.

As illustrated in FIG. 4, the angle α2 between the step surface 81 and the second inner wall surface 44 may not be 90°. It is preferable that the angle between the step surface 81 and the second inner wall surface 44 is in a range from 90° to 150° including 150°. If the angle is greater than 150°, the flow separation of the liquid is less likely to occur when the liquid flows from the second supply flow channel 33B to the drawing flow channel 43 and thus the vibrating flow sufficient for the improvement of the detergency is less likely to be generated.

Test Example

1. Measurement of Vibration Frequency

Figure 5:
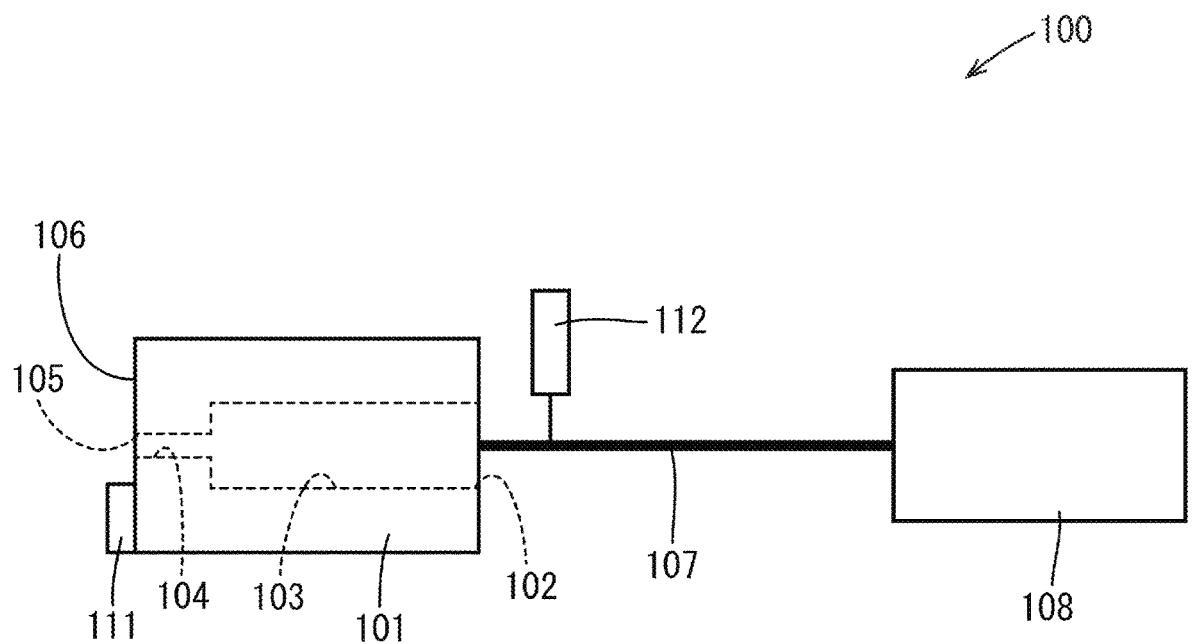
FIG. 5 is a schematic view of a testing device used in a test example to measure vibration frequencies.

A test system 100 illustrated in FIG. 5 was prepared. A supply channel 103 and a cavitator 101 were prepared. The supply channel 103 included a supply port 102 at a first end. The cavitator 101 included a drawing flow channel 104 that included a spout 105 at a second end. A high-pressure pump 108 was connected to the cavitator 101 via a high-pressure hose 107 having a length of 10 m. In the cavitator 101, an acceleration sensor 111 was mounted to an ejection surface 106 including the spout 105. A pressure sensor 112 was mounted to the high-pressure hose 107 at a point adjacent to the cavitator 101.

Figure 6:
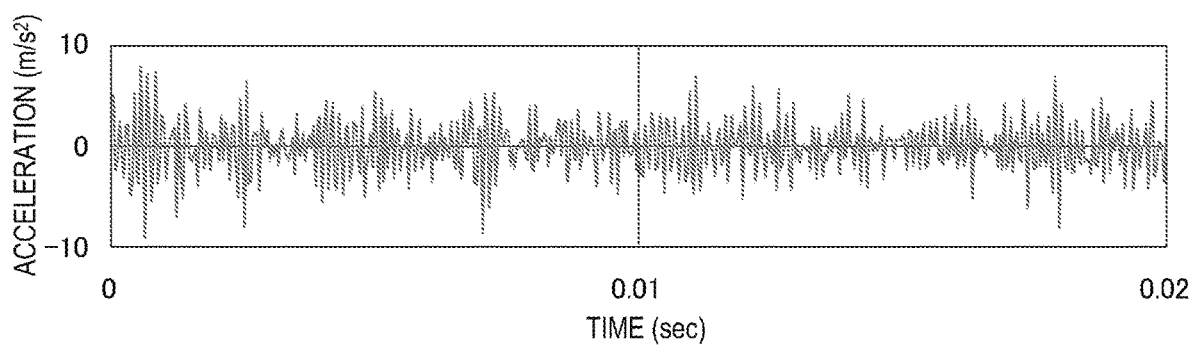
FIG. 6 is a waveform of dynamic acceleration amplitudes measured by an acceleration sensor in the test example to measure vibration frequencies.
Figure 7:
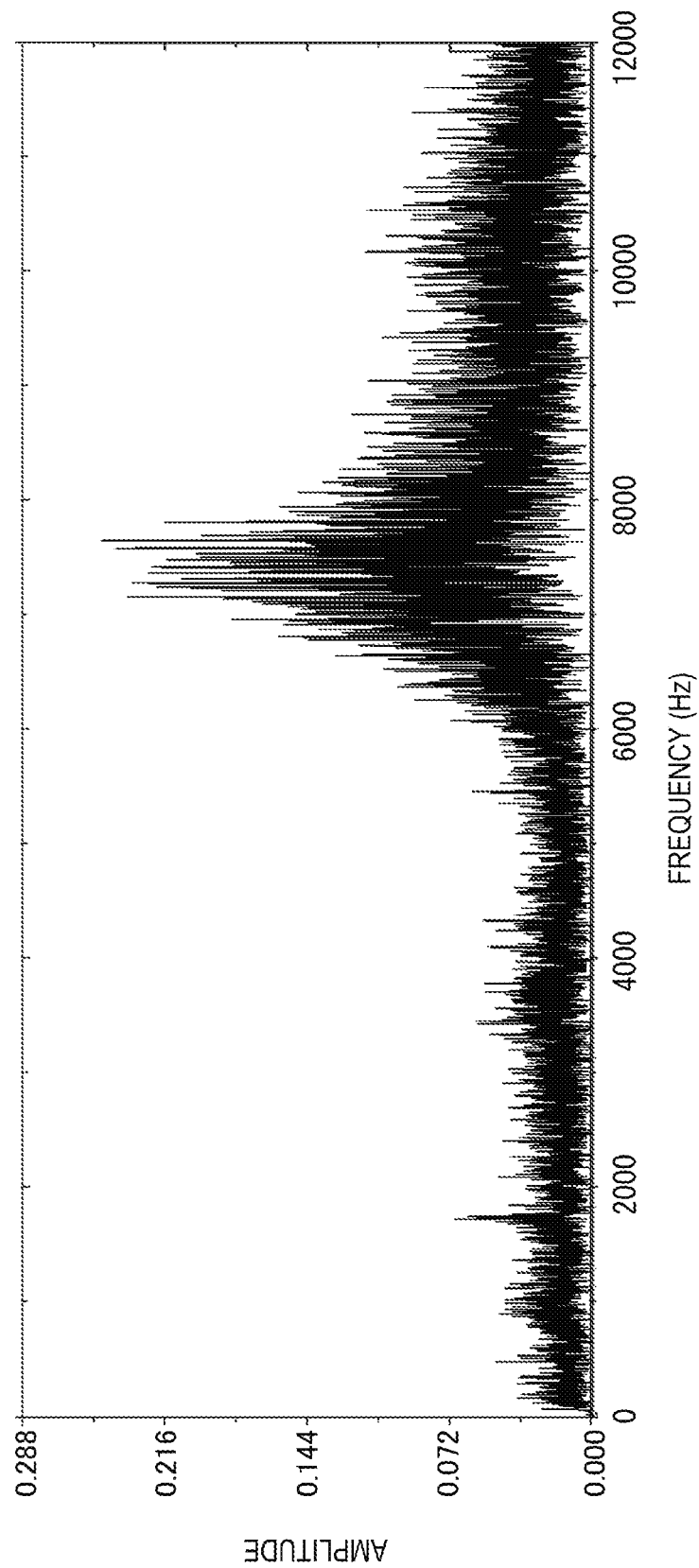
FIG. 7 is a graph illustrating a relation between the frequencies and the amplitudes obtained from measured acceleration vibrations in the test example to measure vibration frequencies.

Using the test system 100, water was ejected by the cavitator 101 with an ejection pressure of 5 MPa and acceleration vibrations transmitted to the ejection surface 106 were measured (see FIG. 6). A frequency analysis was performed on the acceleration vibrations and it was confirmed that a peak was around 8 kHz (see FIG. 7).

2. Cleaning Test

Cleaning tests were conducted using a nozzle that included a vibration generating flow channel having the configuration in the embodiment described above (hereinafter may be referred to as an "embodiment nozzle") and a known nozzle that did not include the vibration generating flow channel (hereinafter may be referred to as a "known nozzle"). Sample including silicon wafers and polystyrene particles having diameters of about 3 μm attached to surfaces of the silicon wafers as pseudo dust particles were prepared. Cleaning was performed on the samples using the embodiment nozzle and the known nozzle under the same condition. The surfaces of the samples were scanned by a special scanner before and after the cleaning and the particles were counted. Removal rates were calculated by equation (2).

Removal rate (%)=100×[(the number of particles before the cleaning−the number of particles after the cleaning)/the number of particles before the cleaning]     (2)

The tests were conducted with the pressure of the high-pressure pump set at 5 MPa, 8 MPa, or 10 MPa. An ejection distance (a linear distance between the ejection outlet of the nozzle and the samples) was 100 mm.

Figure 8:
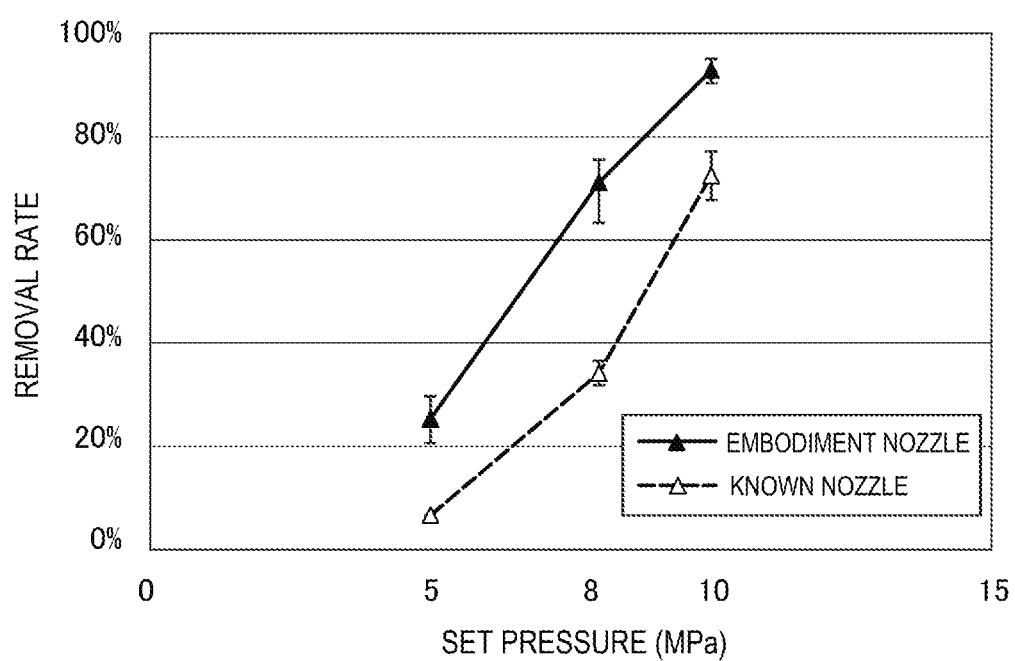
FIG. 8 is a graph illustrating relations between set pressures of a high-pressure pump and removal rates in cleaning tests using a nozzle having the configuration of the embodiment and a known nozzle.

As illustrated in FIG. 8, the removal rates were about 20 to 35% greater in the tests using the embodiment nozzle than in the tests using the known nozzle for the pressures of the high-pressure pump set at the 5 MPa, 8 MPa, and 10 MPa. Namely, the detergency was greater in the tests using the embodiment nozzle than in the test using the known nozzle.

3. Diameter-Velocity Distribution of Particles of Injected Liquid

Using the embodiment nozzle and the known nozzle, water was injected with the ejection pressure of 10 MPa and the diameters and the velocities of the particles of the ejected liquid were measured at a position 100 mm away from the ejection outlets of the nozzles using a shadow Doppler particle analyzer (SDPA).

Figure 9:
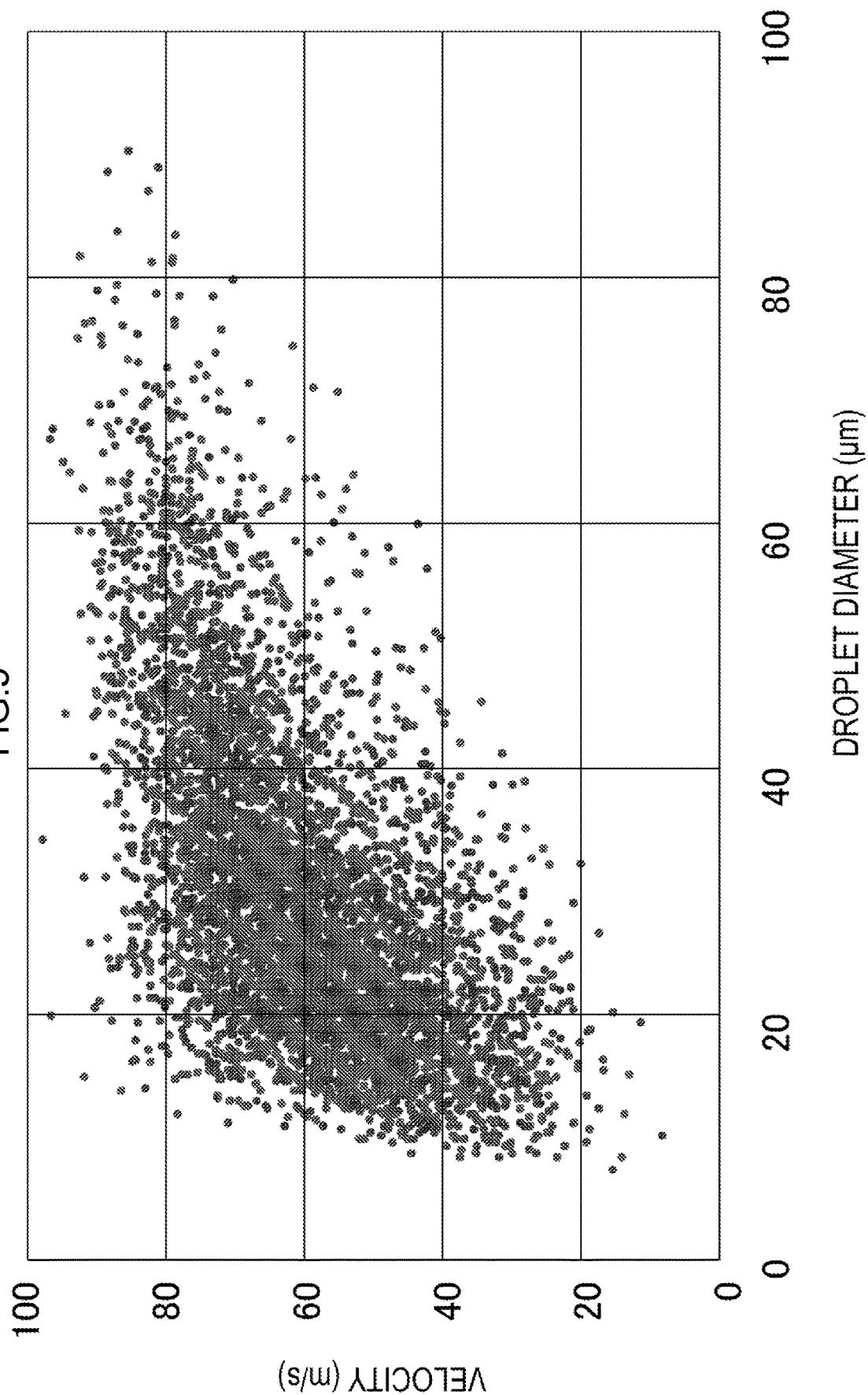
FIG. 9 is a graph illustrating distributions of diameters and velocities of ejected droplets ejected from the nozzle in the embodiment measured by a shadow doppler particle analyzer in the test to examine diameter-velocity distribution of the ejected droplets.
Figure 10:
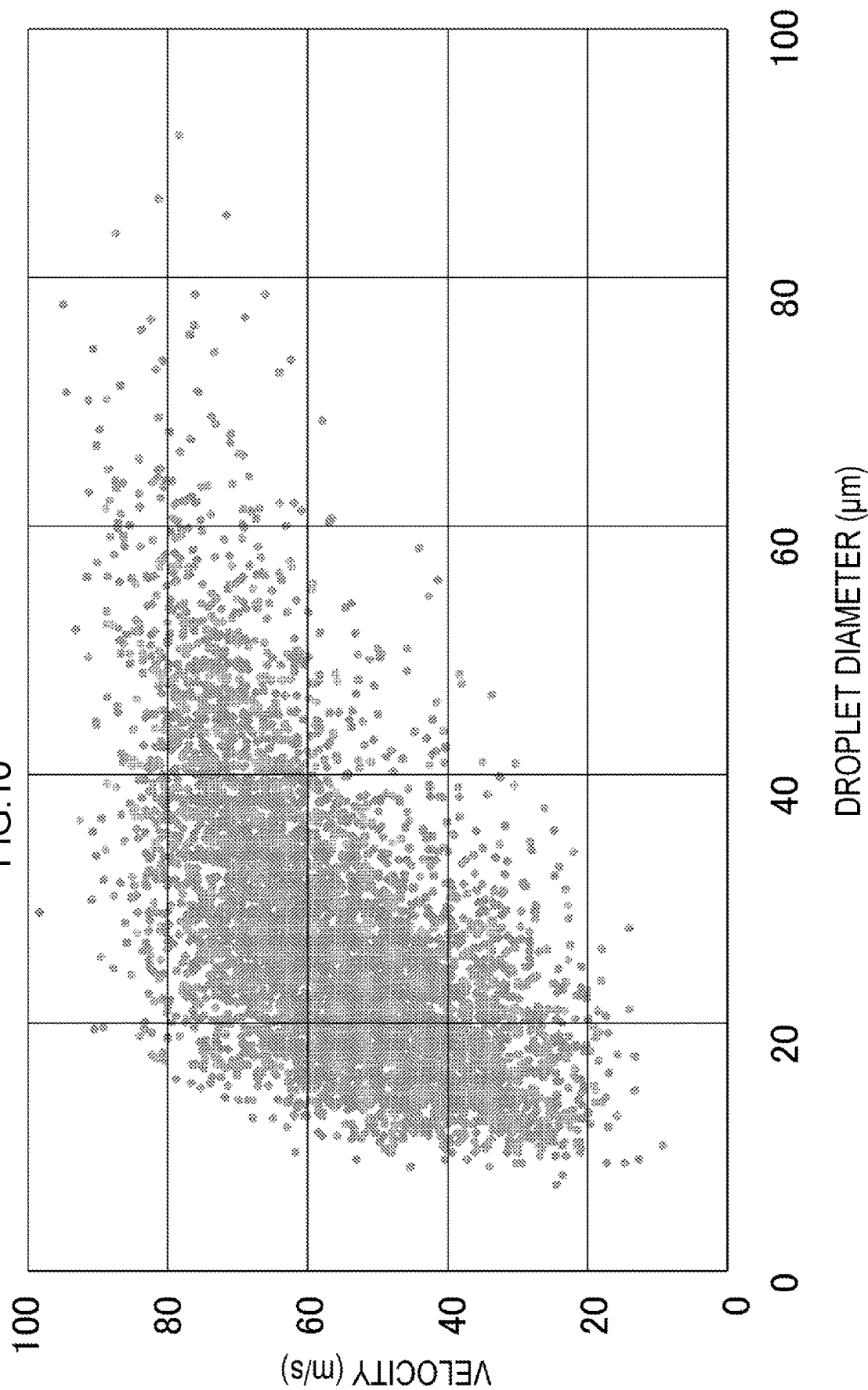
FIG. 10 is a graph illustrating distributions of diameters and velocities of ejected droplets ejected from the known nozzle measured by the shadow doppler particle analyzer in a test to examine diameter-velocity distribution of the ejected droplets.

As illustrated in FIGS. 9 and 10, the diameter-velocity distributions obtained through the tests using the embodiment nozzle were about equal to the diameter-velocity distributions obtained through the tests using the known nozzle. However, the diameter-velocity distributions obtained through the tests using the embodiment nozzle included the slightly greater number of particles, the velocities and the diameter of which were greater.

4. Surface Pressure Distribution

Using the embodiment nozzle and the known nozzle, water was ejected at the ejection pressure of 10 MPa toward a surface pressure sensor disposed at a position 100 mm away from the ejection outlets of the nozzles and the surface pressure distributions of the ejected liquid were measured.

Figure 11:
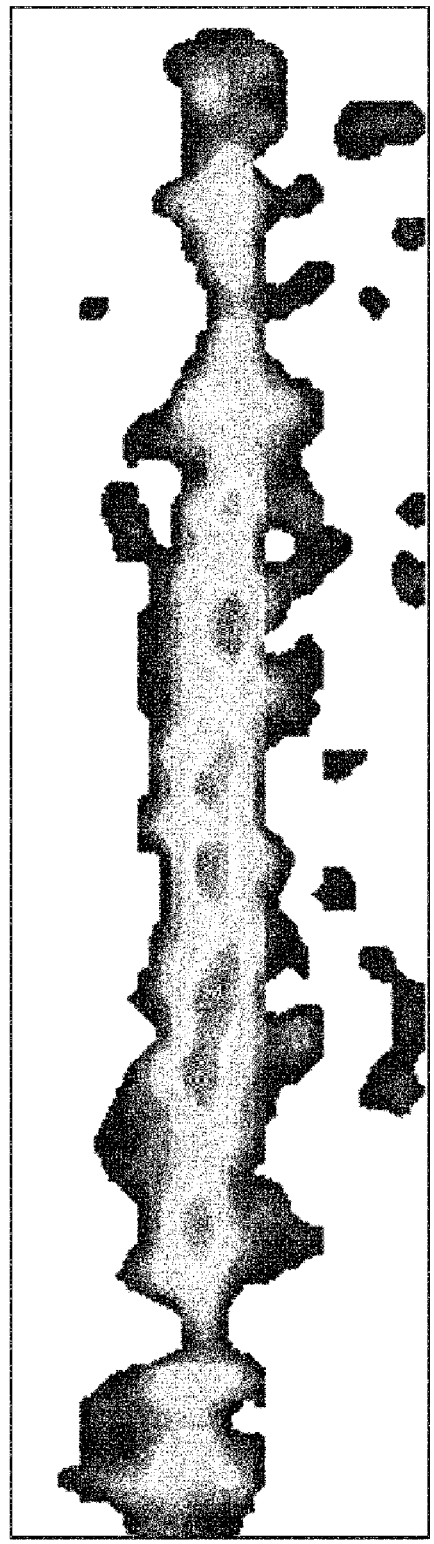
FIG. 11 is a graph illustrating surface pressure distributions of the ejected solution ejected from the nozzle in the embodiment in a test to examine the surface pressure distributions of the ejected solution.
Figure 12:
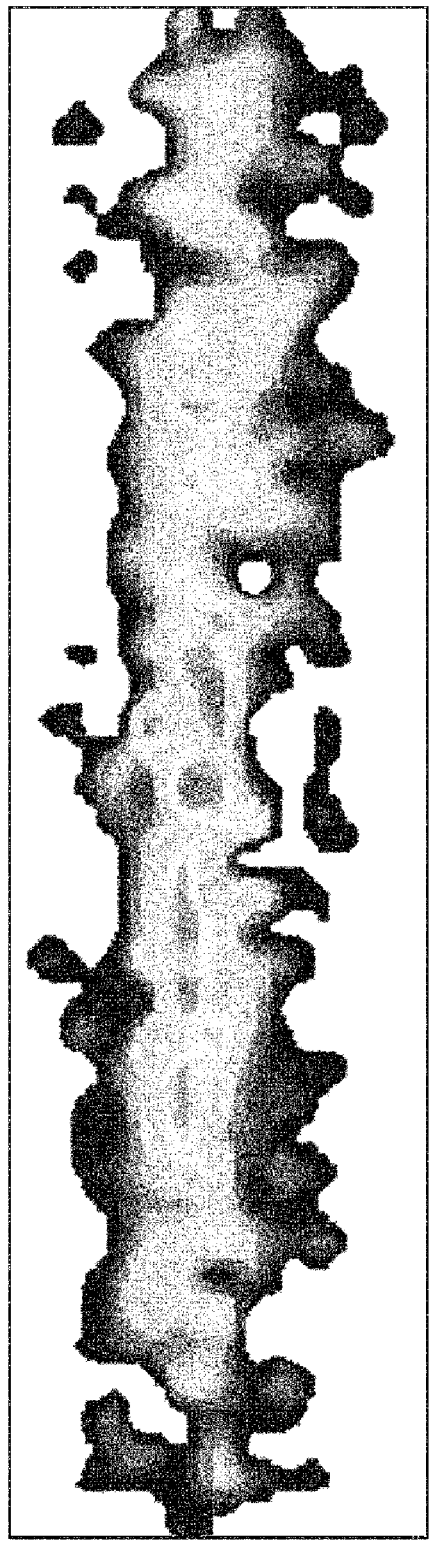
FIG. 12 is a graph illustrating surface pressure distributions of the ejected solution ejected from the known nozzle in a test to examine the surface pressure distributions of the ejected solution.

As illustrated in FIGS. 11 and 12, areas of the surface pressure distributions obtained through the tests using the embodiment nozzle were smaller in comparison to those obtained through the tests using the known nozzle. Furthermore, concentration of higher surface pressures was observed around the center of the surface pressure distributions obtained through the tests using the embodiment nozzle. When the embodiment nozzle was used, the linearity of the ejected liquid increased in comparison to when the known nozzle was used. Although detailed data was not provided, a type of flow of the water immediately after ejected from the known nozzle was a laminar flow and then transformed into a turbulent flow as a distance from the ejection outlet increased. However, when the embodiment nozzle was used, a turbulent flow was observed immediately after the ejection. This may contribute to the increase in the linearity of the ejected liquid and the increase in the detergency.

Other Embodiments (1) In the above embodiment, the nozzles 20 include the accelerating flow channels 55. However, the third flow channels may be configured as linear tubular flow channels having a constant inner diameter.

(2) In the above embodiment, the pipe coupling portions 30, the orifice portions 40, and the accelerating portions 50 are provided as separate components. However, each pipe coupling portion, the corresponding orifice portion, and the corresponding accelerating portion may be provided as a single component. Alternatively, any two of the pipe coupling portions and the orifice portions or the orifice portions and the accelerating portions may be provided as a single component.

The invention claimed is:

1. A nozzle for spraying a liquid on an object, the nozzle comprising:
   a first portion including a first flow channel and a first inner wall surface that defines the first flow channel, the first flow channel including a first inlet through which the liquid enters the first flow channel and a first outlet through which the liquid exits the first flow channel;
   a second portion being joined to the first portion and including a second flow channel and a second inner wall surface that defines the second flow channel, the second flow channel being continuous from the first flow channel, the second flow channel having an inner diameter less than an inner diameter of the first flow channel, the second flow channel including a second inlet through which the liquid enters the second flow channel and a second outlet through which the liquid exits the second flow channel, the second inlet having an inner diameter less than an inner diameter of the first outlet of the first flow channel;
   a third portion being joined to the second portion and including a third flow channel and a third inner wall surface that defines the third flow channel, the third flow channel being continuous from the second flow channel, the third flow channel including a third inlet through which the liquid enters the third flow channel and a third outlet through which the liquid exits the third flow channel, the third inlet having an inner diameter greater than an inner diameter of the second outlet of the second flow channel, the third flow channel including:
      a diameter-decreasing section having an inner diameter gradually decreasing from the third inlet toward the third outlet; and
      a straight section being between the diameter-decreasing section and the third outlet, the straight section having an inner diameter less than the inner diameter of the second outlet of the second flow channel, wherein
   the second portion includes a step surface that connects the second inner wall surface of the second portion to the third inner wall surface of the third portion,
   the diameter-decreasing section extends from the step surface such that the second flow channel, the step surface, and the diameter-decreasing section are continuous, and
   the third inner wall surface of the diameter-decreasing section is directly continuous from the step surface.

2. The nozzle according to claim 1, wherein
   the straight section has a length that is defined such that a ratio of the length to the inner diameter of the straight section is in a range from 7.8 to 15 including 15.

3. The nozzle according to claim 1, wherein
   a ratio of the inner diameter of the first outlet of the first flow channel to the inner diameter of the second inlet of the second flow channel is in a range from 0.04 to 0.8 including 0.8.

4. The nozzle according to claim 1, wherein
the second portion includes a first step surface that connects the first inner wall surface of the first portion to the second inner wall surface of the second portion, and
the second portion has an angle between the first step surface and the second inner wall surface defined in a range from 90° to 150° including 150°.

5. A liquid ejection system comprising:
the nozzle according to claim 1; and
a pump connected to the nozzle to pressurize the liquid and to supply the liquid to the nozzle.

6. The liquid ejection system according to claim 5, wherein the pump pressurizes the liquid such that an ejection pressure at which the liquid is ejected is in a range from 1 MPa to 30 MPa including 30 MPa.

* * * * *